(12) United States Patent
Muench et al.

(10) Patent No.: US 9,780,739 B2
(45) Date of Patent: Oct. 3, 2017

(54) DEVICE AND METHOD FOR REPRODUCING AN AUDIO SIGNAL

(71) Applicant: Harman Becker Automotive Systems GmbH, Karlsbad (DE)

(72) Inventors: Tobias Muench, Straubenhardt (DE); Philipp Schmauderer, Hoefen (DE); Christoph Benz, Ohlsbach (DE); Andreas Koerner, Waldbronn (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 707 days.

(21) Appl. No.: 13/650,904

(22) Filed: Oct. 12, 2012

(65) Prior Publication Data
US 2013/0094665 A1    Apr. 18, 2013

(30) Foreign Application Priority Data

Oct. 12, 2011    (EP) .................................... 11008245

(51) Int. Cl.
*H03G 5/00*    (2006.01)
*H03F 3/181*    (2006.01)
(Continued)

(52) U.S. Cl.
CPC ............... *H03F 3/181* (2013.01); *H03F 1/02* (2013.01); *H03G 5/04* (2013.01); *H03G 5/22* (2013.01);
(Continued)

(58) Field of Classification Search
CPC ...... G06Q 99/00; H04H 20/95; H03G 3/3089; H03G 5/005; G10L 21/0208; G10L 15/20
(Continued)

(56) References Cited

U.S. PATENT DOCUMENTS 4,951,002 A * 8/1990 Hanon .......................... 330/151
5,029,005 A * 7/1991 Morris, Jr. .................... 348/632
(Continued)

FOREIGN PATENT DOCUMENTS

CN    101356741 A    1/2009
EP    1024577 A1    8/2000
(Continued)

OTHER PUBLICATIONS

Extended European Search Report for Application No. 11008245.0, mailed Feb. 14, 2012, 5 pages.
(Continued)

*Primary Examiner* — Davetta W Goins
*Assistant Examiner* — Kuassi Ganmavo
(74) *Attorney, Agent, or Firm* — Brooks Kushman P.C.

(57) ABSTRACT

A device and method for controlling reproduction of an audio signal is provided, wherein the device is operated by means of an energy storage device. The method comprises the steps of deactivating a normal mode and activating an energy saving mode. Power consumption from the energy storage device for reproduction of the audio signal is reduced in the energy saving mode when compared to the normal mode. The method comprises reducing in the energy saving mode, a bass frequency component of a frequency spectrum of the audio signal and outputting the audio signal with reduced bass frequency component. The method further comprises ascertaining a charge state of the energy storage device and controlling the reduction in the bass frequency component based on a decrease in the charge state of the energy storage device.

15 Claims, 5 Drawing Sheets

(51) Int. Cl.
  *H03F 1/02* (2006.01)
  *H03G 5/04* (2006.01)
  *H03G 5/22* (2006.01)
  *H04H 20/95* (2008.01)
  *G10L 15/20* (2006.01)
  *G06Q 99/00* (2006.01)
  *G10L 21/0208* (2013.01)

(52) U.S. Cl.
  CPC ............ *G06Q 99/00* (2013.01); *G10L 15/20* (2013.01); *G10L 21/0208* (2013.01); *H04H 20/95* (2013.01)

(58) Field of Classification Search
  USPC .......... 381/56–57, 86, 98; 700/94; 704/224, 704/225, 200.1
  See application file for complete search history.

(56) References Cited

U.S. PATENT DOCUMENTS

| | | | |
|---|---|---|---|
| 5,150,415 A * | 9/1992 | Jaffee et al. | 381/104 |
| 5,414,386 A * | 5/1995 | Adachi et al. | 330/51 |
| 5,434,922 A * | 7/1995 | Miller et al. | 381/57 |
| 7,715,574 B2 * | 5/2010 | Aikins | 381/107 |
| 2002/0044637 A1 | 4/2002 | Sasaki | |
| 2003/0179672 A1* | 9/2003 | Takashima | G11B 19/00 369/53.18 |
| 2006/0262938 A1* | 11/2006 | Gauger et al. | 381/56 |
| 2007/0064955 A1* | 3/2007 | Saito | 381/58 |
| 2008/0129520 A1* | 6/2008 | Lee | 340/636.1 |
| 2008/0205666 A1* | 8/2008 | Tanghe | 381/98 |
| 2008/0306744 A1 | 12/2008 | Wang et al. | |
| 2009/0257601 A1* | 10/2009 | Motsenbocker | 381/71.11 |

FOREIGN PATENT DOCUMENTS

| | | | | |
|---|---|---|---|---|
| FR | 2707131 A1 | | 1/1995 | |
| JP | 09-223938 A | | 8/1997 | |
| JP | 09223938 A | * | 8/1997 | |
| JP | 2003-280689 A | | 10/2003 | |
| JP | 2006-079782 A | | 3/2006 | |
| JP | 2006079782 A | * | 3/2006 | |
| JP | 2007-280033 A | | 10/2007 | |
| JP | 2007280033 A | * | 10/2007 | |
| JP | 2009-515215 A | | 4/2009 | |
| JP | 2009-171647 A | | 7/2009 | |
| JP | 2009171647 A | * | 7/2009 | |
| WO | 2007/053120 A1 | | 5/2007 | |
| WO | WO 2007053120 A1 | * | 5/2007 | ............ G10L 19/24 |
| WO | WO 2010041147 A2 | * | 4/2010 | |

OTHER PUBLICATIONS

Office action for foreign counterpart application CN 201210387539.8, dated Dec. 3, 2014, 5 pages.
Office action for foreign counterpart application JP 2012-226338, dated Aug. 15, 2013, 4 pages.
Office action for foreign counterpart application JP 2012-226338, dated Oct. 24, 2013, 2 pages.
Office action for foreign counterpart application KR 10-2012-0112261, dated Oct. 31, 2013, 6 pages.
European Office Action for Application No. 11 008 245.0-1805, mailed Aug. 29, 2016, 5 pages.

* cited by examiner

DEVICE AND METHOD FOR REPRODUCING AN AUDIO SIGNAL

CROSS-REFERENCE TO RELATED APPLICATIONS

This application claims the benefit of EP Application No. 11008245.0-1233, entitled "Device and Method for Reproducing an Audio Signal," filed on Oct. 12, 2011, the disclosure of which is hereby incorporated by reference in its entirety.

TECHNICAL FIELD

The present application relates to a device and a method for reproducing an audio signal.

BACKGROUND

EP1024577(A1) provides a power system that is known to include secondary batteries and a charging circuit. Another circuit is shown in U.S. Pat. No. 5,771,471 that provides a charge regulator for a radio telephone. U.S. Publication No. 2002/0044637 A1 provides a power circuit that is capable of improving use efficiency of a chemical cell.

SUMMARY

According to one aspect, an improvement to a device is described through a device with the features of independent claim 1. Advantageous developments are the subject matter of dependent claims, and are contained in the description.

Accordingly, a device is provided for reproducing an audio signal. The device may have a first interface for connection to an energy storage device. The energy storage device may comprise a battery, a fuel cell, or a rechargeable battery. The first interface may have connections for energy supply and/or signal connections.

The device may have a second interface for connection to a loudspeaker. The second interface may be a preamplifier output and/or a final amplifier output for outputting the audio signal. The loudspeaker may be connected to the second interface by means of a cable. It is possible for the loudspeaker to be connected to the second interface through an amplifier, such, for example, as a subwoofer.

The device may have an amplifier, which may be connected to the second interface and may be configured to amplify the audio signal. The amplifier may be a preamplifier or a power amplifier. The amplifier of the device may be connectable to the energy storage device for operation.

The device may have a control device, which may be connected to the first interface and to the amplifier. The control device may have a computing unit, such as for example a microcontroller, a signal processor, and/or a CPU for executing a control program, wherein the control program may provide control functions of the control device.

The control device may be configured to operate in a normal mode and in an energy saving mode. In the energy saving mode, a power consumption of electrical energy from the energy storage device is reduced for reproduction of the audio signal when compared to the audio signal while in the normal mode.

In the energy saving mode, the control device may be configured to reduce a bass frequency component of a frequency spectrum of the audio signal and to output the audio signal through the second interface with the reduced bass frequency component.

The control device may be configured to determine a charge state of the energy storage device. The energy storage device may transmit a digital or analog charge state signal to the control device such that a charge state is determined.

The control device may be configured to control the reduction in the bass frequency component based on a decrease of the charge state of the energy storage device. The control device may be configured to reduce the bass frequency component by means of a function when there is a decrease in the charge state. The bass frequency component may be reduced proportionately or by means of a Look Up Table (LUT).

According to one aspect, an improvement to a method is described through a method with the features of an independent claim. Advantageous developments are contained in the description.

Accordingly, a method is provided for controlling a reproduction of an audio signal. The audio signal may be reproduced by a device that is operated by means of an energy storage device.

In the method, a normal mode may be deactivated and an energy saving mode may be activated. In the energy saving mode, power consumption from the energy storage device may be reduced while the audio signal is being reproduced when compared to the normal mode.

In the energy saving mode, a bass frequency component of a frequency spectrum of the audio signal may be reduced and the audio signal may be output with the reduced bass frequency component.

A charge state of the energy storage device may be determined during the energy saving mode.

The reduction in the bass frequency component may be controlled based on a decrease in the charge state of the energy storage device.

The developments described below relate to the device as well as to the method for reproducing an audio signal.

According to one embodiment, the control device may be connectable to a database with stored audio files. Metadata associated with the audio files may be stored in the database. The metadata may be ID3 tags and other data as applicable.

An energy value for each audio file may be stored as an item of the metadata. The energy value may be based on the bass frequency component of a frequency spectrum of the applicable audio file. The energy value may be determined using a transformation in the frequency range and stored.

The control device may be configured to determine an energy threshold based on the charge state of the energy storage device. In one embodiment, the control device may be configured to evaluate at least one additional input quantity for determining the energy threshold. The additional input quantity may depend on other electrical devices such as an electric motor or a solar cell that affects the charge state of the energy storage device. A distance to destination or a remaining travel time of an electric vehicle may be used for determining the energy threshold.

To control the bass frequency component, the control device may be configured to determine an audio file to be output based on the energy threshold and on the associated energy value of the audio file from the database. The control device may be further configured to output the audio file as the audio signal.

According to one embodiment, the control device may be configured to use a digital or analog filter for filtering the audio signal to be output in order to reduce the bass frequency component. Such a filter may be an analog or digital high-pass filter or band-pass filter. The filtering by the filter may be combined with the above-described selection using the energy threshold.

In one embodiment, the control device may be configured to determine a threshold frequency of the filter based on the charge state of the energy storage device. The threshold frequency of the filter may be increased for low frequencies of the audio signal as the charge state decreases.

In one embodiment, the control device may be configured to determine a current position and a route to a destination with a distance to destination. The distance to the destination preferably may be determined by a Global Positioning System (GPS). The distance between the current position and the destination may be determined via the GPS. The charge state needed for this range may be determined on the basis of the distance. For example, a difference may be ascertained between the current charge state and the necessary charge state for reaching the destination. As such, the reduction in the bass frequency component may be controlled by means of the ascertained difference. Therefore, the control device may be configured to control the reduction in the bass frequency component based on the current charge state and the distance to the destination.

In one embodiment, the control device may be configured to activate the energy saving mode via an input through an input unit.

The variant embodiments described above are advantageous, both individually and in combination. All embodiments may be combined with one another. Some possible combinations are explained in the description of the drawings. However, these combinations of the variant embodiments introduced herein are not exhaustive.

DETAILED DESCRIPTION

Figure 1:
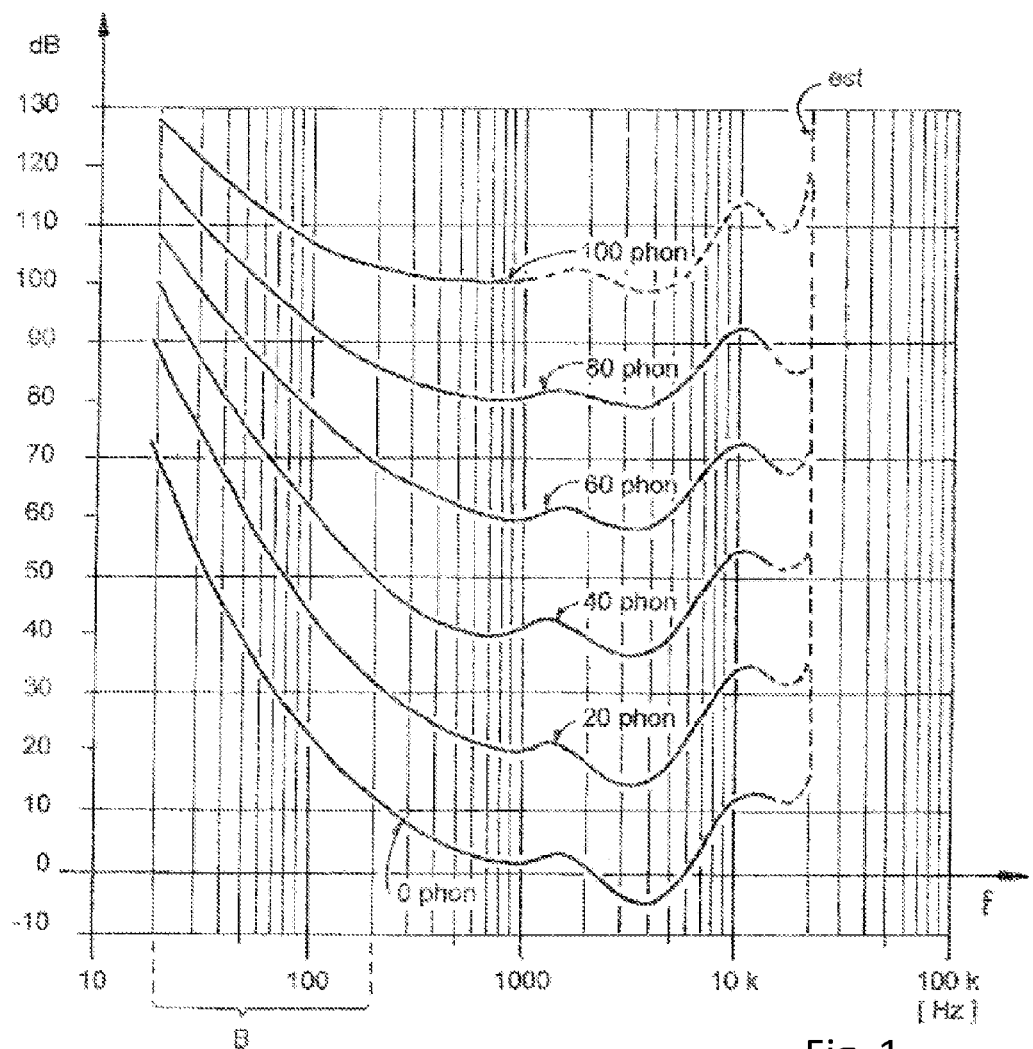
FIG. 1 is a schematic diagram that depicts curves of equal loudness.

Shown schematically in FIG. 1 is a diagram with curves of equal loudness pursuant to ISO standard 226(2003). FIG. 1 is a graph illustrating a loudness level (e.g., with phon as a unit of measure) as a function of frequency. FIG. 1 illustrates that the perceived loudness is strongly frequency-dependent. The frequency dependence is in turn sound-pressure-dependent, which indicates that different frequency dependencies exist for different levels. For this reason, a frequency spectrum $X(f_{S_A})$ of the sound is to be determined if statements are to be made about the perception of a sound event. In addition, a sound event that extends over multiple frequency groups (overtones) and time behavior of such a sound event also have an effect on the perception of loudness. The perceived loudness can be quantified as a function of frequency. For example, it is known to use an A-filter for evaluation such that the frequency filter used in each case can be appended to the dB value (dB=decibels) in parentheses, as for example 20 dB(A). The curves have regions est. that are extrapolated by calculation.

The curves with equal perceived loudness level (e.g. 20 phon) represented in FIG. 1 illustrates that the sound pressure dB with a bass frequency component B, also called bass portion B, rises sharply with a decreasing frequency below approximately 200 Hz. In order to reproduce a sound event in the bass frequency component "B", a significantly higher sound pressure dB may be generated when compared to a frequency of 1 kHz. Thus, when a sound event is reproduced with a loud speaker, higher electrical power is needed to generate the high sound pressure dB of the bass portion B. If, for example, a sound event with a bandwidth of 20 Hz to 2 kHz is to be reproduced with a perceived loudness level of 20 phon, then a sound pressure of approximately 20 dB is to be generated for the frequency of 2 kHz. In contrast, a sound pressure of 90 dB is to be generated for the frequency of 20 Hz. Consequently, more electrical power must be applied for the bass portion B in the low-frequency range in order to produce the same perception of loudness in the human ear as at mid-range or high audio frequencies.

Furthermore, the required electrical power depends on an efficiency and/or a directional characteristic of the loudspeaker. For example, tweeters may have a higher efficiency than woofers. The higher the frequency, the more the sound is directed and the power theoretically increases at the listening point. The lower the frequency becomes, the more omnidirectional the sound becomes, requiring more power for the same sound pressure at the listening point. Furthermore, the radiated power may decrease when the wavelength of the frequency is smaller than a membrane radius. Moreover, the acoustical space may influence the sound pressure in a frequency-dependent manner. For example, a pressure chamber effect occurs in a motor vehicle. When all physical effects that act are taken into account, the majority of the electrical power is required for the bass portion B at the same perceived loudness.

Figure 2:
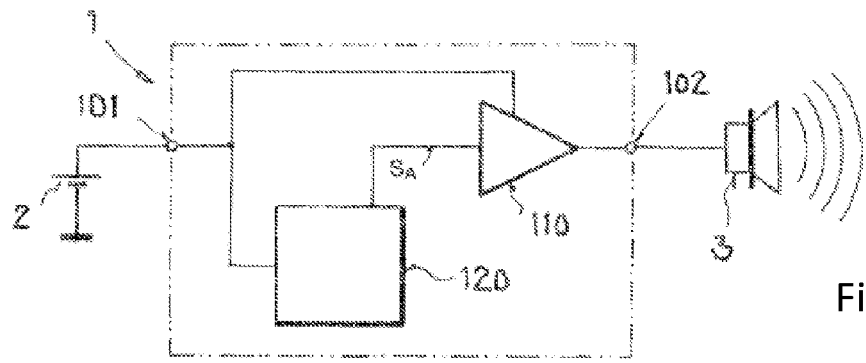
FIG. 2 is a schematic block diagram.

FIG. 2 schematically shows a device 1 for reproducing an audio signal, "$S_A$". The device 1 may be an infotainment system of a motor vehicle or a portable player for the audio signal $S_A$. The device 1 may have a first interface 101 for connection to a rechargeable battery 2 as an electrical storage device. The device 1 also may have a second interface 102 for connection to a loudspeaker 3. For example, the loudspeaker 3 may be connected directly to a connection of the second interface 2 via cables. It is also possible to connect the loudspeaker 3 to the second interface 102 through a subwoofer amplifier (not shown). The device 1 may have an amplifier 110 that may be connected to the second interface 102 and may be configured to amplify the audio signal $S_A$. For operation, the amplifier 110 may be connected to the rechargeable battery 2 through the first interface 101. In addition, the device 1 may have a control device 120, which may be connected to the first interface 101 and to the amplifier 110.

Figure 3:
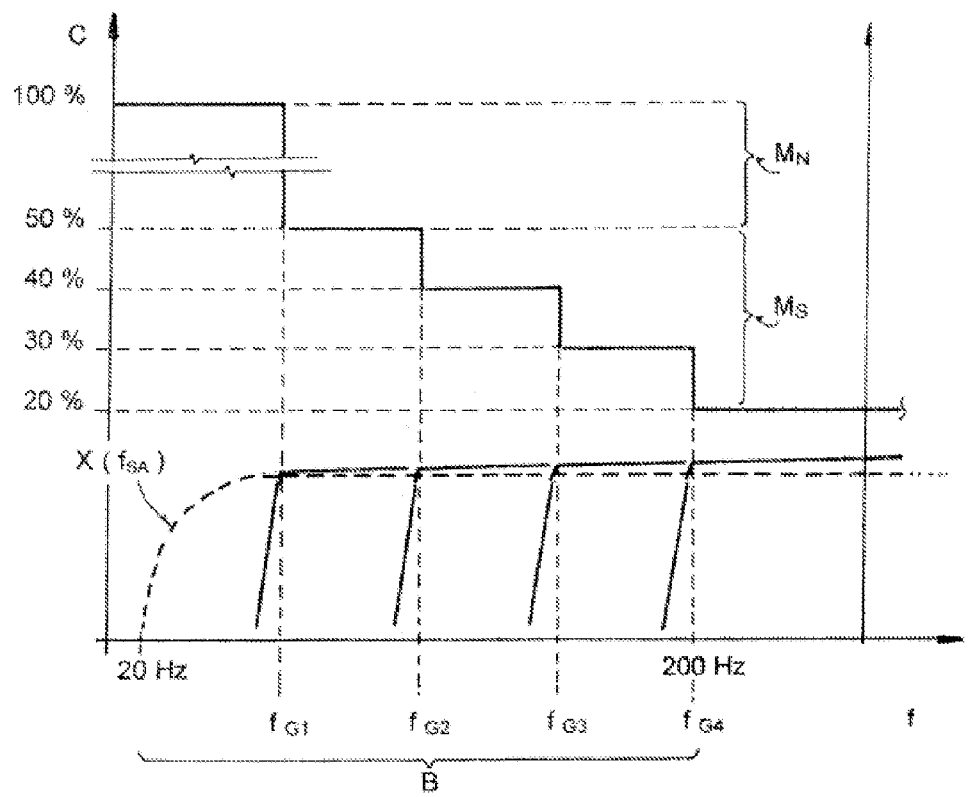
FIG. 3 is a schematic diagram from an exemplary embodiment.

One embodiment is explained in detail with reference to the diagram in FIG. 3. A charge state "C" of the rechargeable battery 2 is shown at respective charge states (e.g., 20%, 30%, 40%, 50% and 100% charge). In one embodiment, a charge state C of 50% or greater may be associated with a normal mode "$M_N$" and a charge state C of 50% or less may be associated with an energy saving mode "$M_S$" in connection to the device 1. Also shown by way of example, is a frequency spectrum $X(f_{S_A})$ of the audio signal $S_A$ with respect to the frequency f. The control device 120 may be configured to reduce a power consumption from the rechargeable battery 2 while reproducing the audio signal $S_A$ when the device 1 is in the energy saving mode $M_S$ when compared to the device 1 operating in the normal mode $M_N$. In one embodiment, the bass portion B of the audio signal $S_A$ may be reduced in the energy saving mode $M_S$ by the audio signal $S_A$ being high-pass filtered. In FIG. 3, the frequency response of the filtering is shown for different threshold frequencies $f_{G1}$, $f_{G2}$, $f_{G3}$, $f_{G4}$. The audio signal $S_A$ may be output with the reduced bass portion B after the high-pass filtering.

The control device 120 may be configured to determine the charge state C. For example, an electrical quantity of the rechargeable battery 2, such as the rechargeable battery voltage or its behavior over time, may be measured by the control device 122 for this purpose. The control device 120 may be configured to control the reduction in the bass portion B based on a decrease in the charge state C of the rechargeable battery 2. From FIG. 3, the reduction in the bass portion B may be accomplished by filtering. In one embodiment, the control device 120 may perform the digital and/or analog high-pass filtering. In one embodiment, the control device 120 may include a controllable filter function. In one embodiment, the high pass filter may be activated or deactivated as a function of the charge state C. For instance, the high-pass filter may be deactivated at a charge state C above 50%.

From FIG. 3, the high-pass filtering may be controlled by the control device 120 in that a cut-off frequency $f_{G1}$, $f_{G2}$, $f_{G3}$, $f_{G4}$ of the high-pass filtering is altered. The high-pass filtering may be deactivated in the normal mode $M_N$ at a charge state C above 50%. A first cut-off frequency value $f_{G1}$ may be associated with a charge state C between 40% and 50%. A second cut-off frequency value $f_{G2}$ may be associated with a charge state C between 30% and 40%. A third cut-off frequency value $f_{G3}$ may be associated with a charge state C between 20% and 30%. A fourth cut-off frequency value $f_{G4}$, for example, 200 Hz may be associated with a charge state C below 20%. The cut-off frequencies $f_{G1}$, $f_{G2}$, $f_{G3}$, $f_{G4}$ may be controlled as a function of the charge state C by means of a step function. Alternatively, a proportional dependency may be provided. It is also possible to deactivate a subwoofer amplifier in energy saving mode $M_S$. In addition to the charge state C, additional input quantities may be analyzed for controlling the reduction. This will be explained in more detail in connection with FIG. 5.

Figure 4:
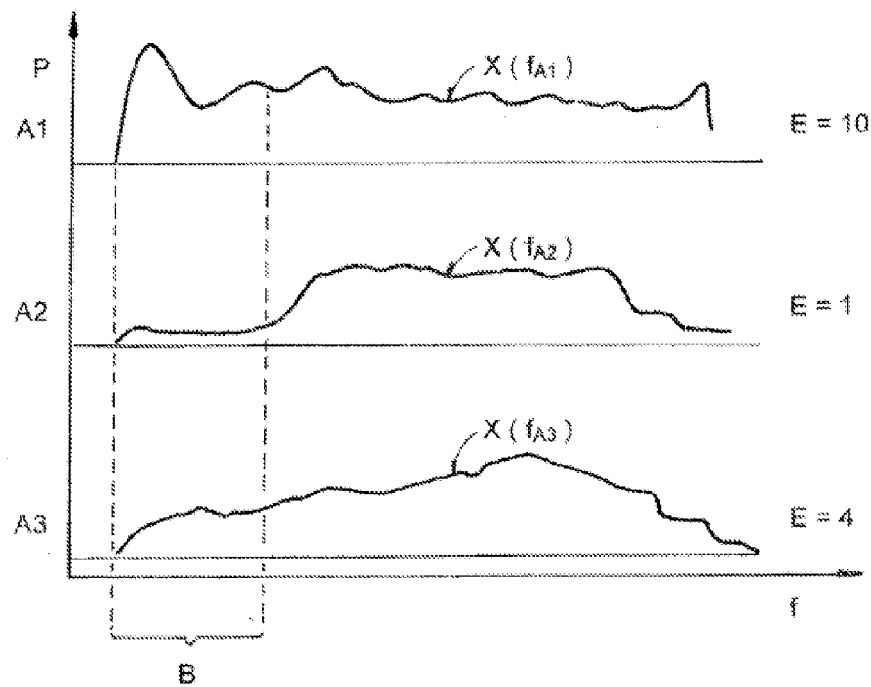
FIG. 4 is another schematic diagram for another exemplary embodiment.

The control device 120 may have a connection to a database 130 (see FIG. 5, 130) for which will be used to explain the graph of FIG. 4. The database 130 may have audio files $A_1$, $A_2$, $A_3$ and metadata associated with each audio file $A_1$, $A_2$, $A_3$. In this configuration, an energy value E may be included in the metadata. FIG. 4 illustrates one frequency spectrum $X(f_{A1})$, $X(f_{A2})$, $X(f_{A3})$ for each audio file $A_1$, $A_2$, $A_3$ and an associated energy value E stored in the database 130. Thus, the energy value associated with the first data file $A_1$ is E=10, the energy value associated with the second audio file $A_2$ is E=1, and the energy value associated with the third audio file $A_3$ is E=4. The applicable energy value E may be determined on the basis of a power "P" in the bass portion B of the spectrum $X(f_{A1})$, $X(f_{A2})$, $X(f_{A3})$. For example, the power P may be acquired as the average over an entire length of the audio file $A_1$, $A_2$, $A_3$.

Figure 5:
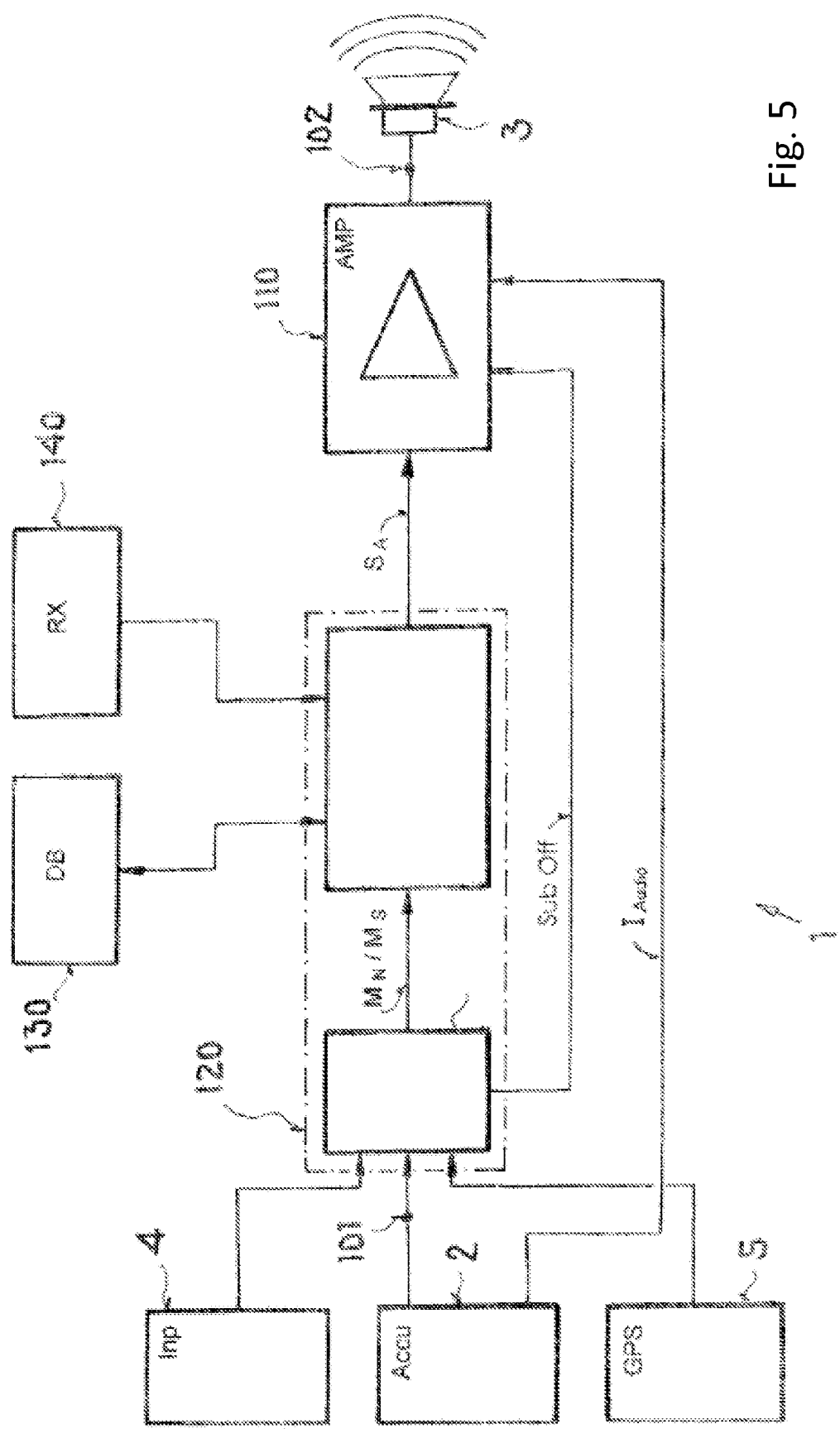
FIG. 5 is a schematic representation of a device for reproducing an audio signal.

In FIG. 5, a device 1 for reproducing the audio signal $S_A$ is explained in detail. The device 1 may include the control unit 120, which may be connected through the first interface 101 to the rechargeable battery 2 (e.g. "Accu"). In addition, the device 1 may include the amplifier 110 (e.g. "AMP"), which may be connected to the loudspeaker 3 through the second interface 102. The amplifier 110 may comprise multiple amplifier units, and may be supplied with a current "$I_{Audio}$" from the rechargeable battery 2. A subwoofer amplifier unit may be additionally activated and deactivated by means of a control signal "SubOff". The amplifier 110 may be configured to output the amplified audio signal $S_A$ to the loudspeaker 3.

The device 1 includes the control unit 120 for outputting the audio signal $S_A$ to the amplifier 110. The control device 120 may be configured to operate in the normal mode $M_N$ and in the energy saving mode $M_S$. The control device 120 may be configured to generate control signals associated with the normal mode $M_N$ and the energy saving mode $M_S$. The activation and deactivation of normal mode $M_N$ and energy saving mode $M_S$ may be accomplished by means of input signals, such as an input by a user by means of an input unit 4 and/or receipt of a monitoring signal of the energy storage device 2, such as an output voltage of a rechargeable battery, and/or receipt of a position-dependent signal from a navigation unit, such as a distance to a destination of a route. The energy saving mode $M_S$ may be activated and deactivated based on the input signals, where power consumption from the energy storage device 2 while reproducing the audio signal SA is reduced (i.e., the control device 120 operates in the energy savings mode $M_S$).

Music played in an electric motor vehicle may be manipulated as a function of the charge state C of the rechargeable lithium-ion battery in such a manner that low-power titles can be played as needed or the music played can be altered of high-power low frequencies by filtering. In this way, the energy saved in the rechargeable battery 2 by the device 1 may benefit the range of the motor vehicle. In addition, a loudness adjustment may also take place.

Music systems in electric motor vehicles consume electrical energy. If the energy is to be used for the range of the electric vehicle, the option exists of manually turning off the music system entirely. However, if vehicle occupants do not wish to forego the enjoyment of music altogether, the energy that is available is to be distributed intelligently. When the rechargeable battery has a low charge, only low power music 1 may be outputted at the loud speaker 3. The low-power music may be obtained by categorizing the music pieces and/or by filtering out high-power portions of the frequency spectrum. This may have a direct effect on the acoustic power and, at the same time, on electrical power consumption.

Electrical power consumption of a music system in an electric vehicle depends largely on the playing loudness and the frequency spectrum $X(f_{SA})$ of the audio signal $S_A$ that is output. The acoustic power emitted through the loudspeaker 3 is directly related to the electrical power. Since the range of an electric vehicle depends on the charge state C of the rechargeable battery 2, the range is increased when the music system, as an energy consumer, conserves current $I_{Audio}$ for amplification of the audio signal $S_A$ to be output.

The control unit 120 may be connectable to multiple audio signal sources 130, 140. A database 130 (e.g., one of the audio signal sources) is connected through an interface or a network and may permit the selection and output of an audio file as the audio signal $S_A$. A receiving device "RX" 140 may be designed for audio reception, in particular via radio. The receiving device 140 may have a UHF receiver or a DAB receiver or the like.

Figure 5A:
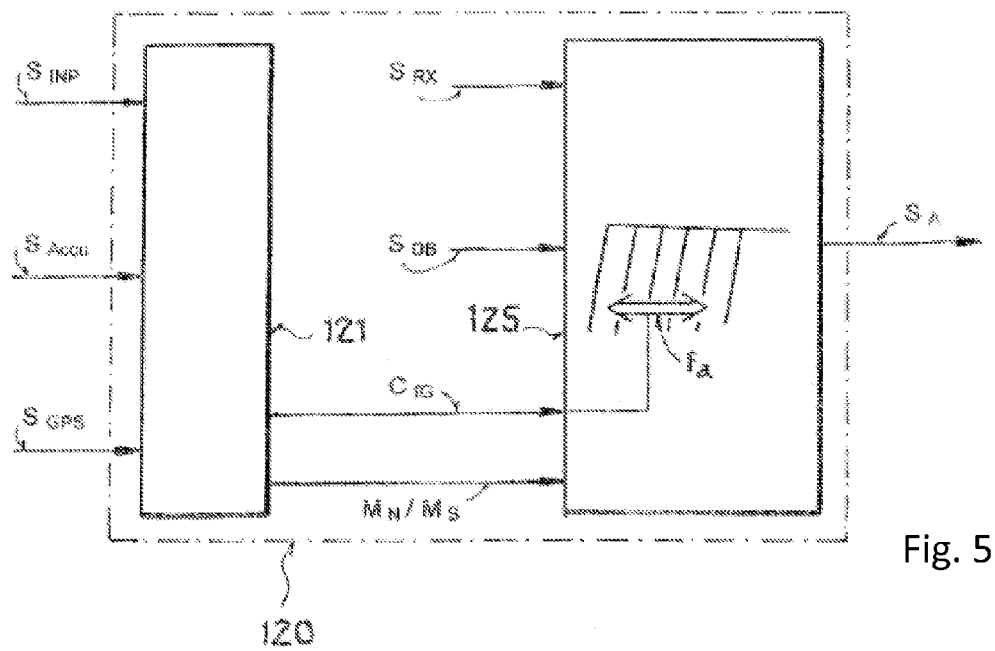
FIG. 5a is a schematic embodiment of a control device.

FIG. 5a illustrates one embodiment of the control device 120 with an analysis unit 121 and a digital and/or analog filter 125. Electrical energy may be taken from the audio signal $S_A$ by means of filtering by the filter 125 when a filtering operation is performed. The filter 125 may have a high-pass filter or a band-pass filter, which acts on the audio signal $S_A$. The audio signal $S_A$ is provided from any desired source, such as the receiving device 140, a CD player or an MP3 player. In reference to FIG. 5a, a cut-off frequency $f_G$ of the filter 125 may be adjusted as a function of a charge state C of the rechargeable battery 2 and/or of a remaining travel time/distance determined by the navigation unit 5.

In one exemplary embodiment, the analysis unit 121 may be configured to analyze the signal $S_{INP}$ from the input unit 4 and/or the signal $S_{Accu}$ from the rechargeable battery 2 and/or the signal $S_{GPS}$ from the navigation unit 5. The signal $S_{INP}$ from the input unit 4 may be generated from input entered by the user on a touch screen. The signal $S_{Accu}$ from the rechargeable battery 2 may be generated based on a voltage or a current budget of the rechargeable battery 2 and may depend upon the charge state C of the rechargeable battery 2. The signal $S_{GPS}$ from the navigation unit 5 may be determined as a function of, e.g., a remaining travel time or a distance to be traveled that has been determined by the navigation unit 5.

Using the input signals $S_{INP}$, $S_{Accu}$, $S_{GPS}$ the analysis unit 121 may generate a signal $M_N/M_S$ for controlling an activation or deactivation of a normal mode $M_N$ and an energy saving mode $M_S$. Furthermore, the analysis unit 121 may transmit a control signal $C_{fG}$ to adjust the cut-off frequency $f_G$ of the filter 125. The filter 125 filters the bass portion B out of the input signal $S_{DB}$ (from the database 130) or out of the input signal $S_{RX}$ (from the receiving unit 140). The control may take place in accordance with the diagram for the exemplary embodiment in FIG. 3 by means of a LUT (Look Up Table). The lower the charge state C of the rechargeable battery 2 is, the higher the cut-off frequency $f_G$ may be set, since low frequencies in a bass portion B of the spectrum $X(f_{SA})$ consume more electrical energy. In addition, a provision is made for the amplifier and the loudspeaker to be switched off for low frequencies on the basis of the energy saving mode $M_S$ and/or the threshold frequency $f_G$ (see FIG. 5). It may be acoustically advantageous for the cut-off frequency $f_G$ of the filter 125 to be modified slowly over time. For example, this may be performed by means of a timer and/or as a function of the change state C over time of the rechargeable battery 2.

Figure 5B:
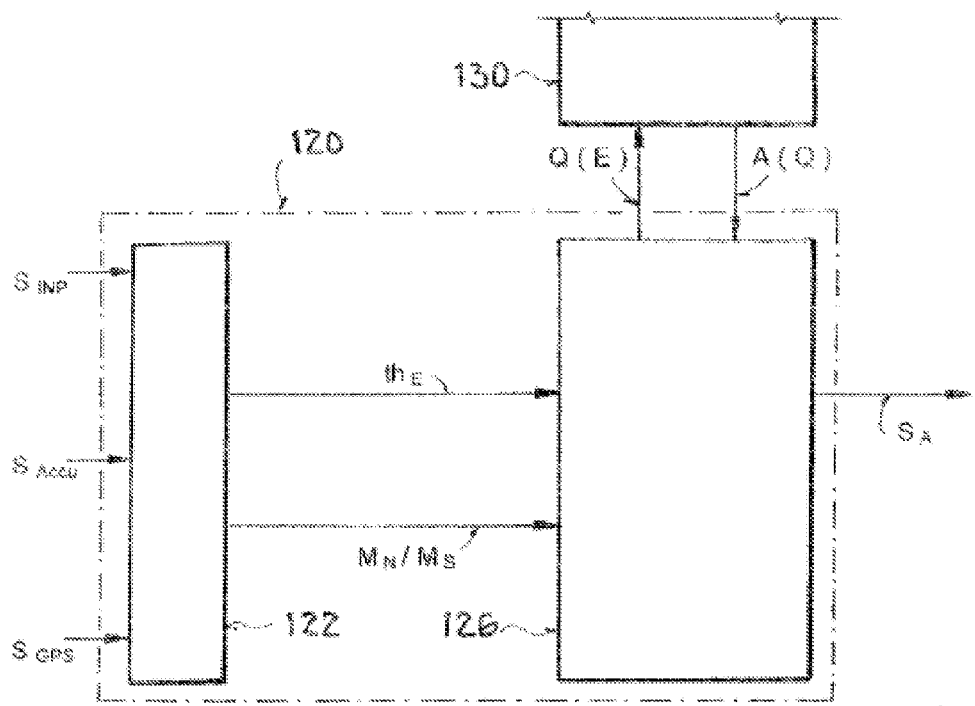
FIG. 5b is another schematic embodiment of another control device.

It is possible to select from among low-power music titles (see FIG. 5b). For example, the control unit 120 may have an analysis unit 122 and a selection unit 126. The energy content of each music title in the database 130 may be determined and an associated energy value E may be stored in the database 130 with metadata for the applicable music piece. For example, the energy content may be categorized from 1 to 10 by means of a scale of the energy values. For example, an energy value, E=1 is indicative of very low power with a small bass portion B. This music title can be played when the rechargeable battery 2 is in critically low charge states C. An energy value, E=10 is indicative of a very high power with a large bass portion B. This music title is not played in critical charge states C.

If the user is listening to content from his/her MP3 database 130, audio files $A_1, A_2, A_3$ of titles in the database 130 may be selectively permitted based on a function of the charge state C of the rechargeable battery 2 and based on, when applicable, a function of the remaining travel time/distance (see FIG. 5b). The determination regarding permissibility may be made on the basis of an energy threshold $th_E$. For example, all audio files $A_1, A_2, A_3$ from the database 130 that have an energy value E lower than the energy threshold $th_E$ may be queried by means of a signal query Q(E). The threshold may be $th_E=5$, so that only the second audio file $A_2$ and the third audio file $A_3$ may be read out (see, FIG. 4). The audio files A(Q) dependent on the query Q(E) that are output may be looped through the control unit 120, additionally optionally filtered, and may be output as audio signal $S_A$ with reduced bass portion B. Embodiments in FIG. 5a and FIG. 5b may be combined with one another in the control unit 120 as deemed in order to achieve optional results.

Figure 6:
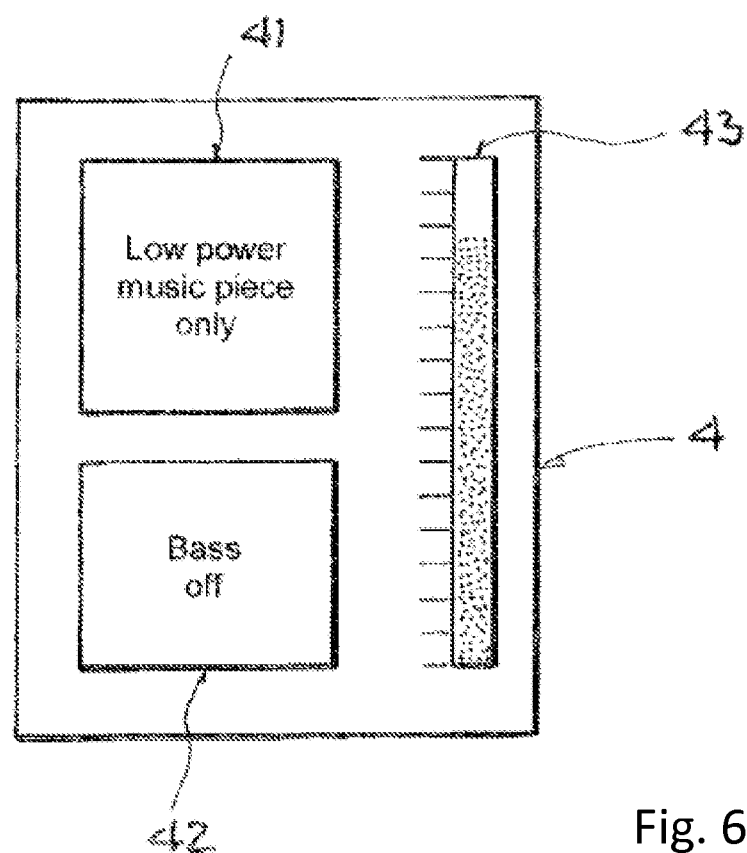
FIG. 6 is a schematic embodiment of an input unit.

FIG. 6 depicts the input unit 4 as a touch screen. The touch screen 4 included with a graphical user interface with various fields (or widgets). A first icon 41 may permit the activation or selection of only low power music pieces, in which their corresponding energy value E is below the energy threshold $th_E$ (see FIG. 2). A second icon 42 may enable the filter 125 to reduce the bass portion B (see FIG. 5A). In addition, a consumption indicator 43 may be shown on a widget on the touch screen, which symbolizes energy consumption in the form of a bar graph, for example. It is likewise possible for the consumption indicator 43 to act as an input function (e.g., a third selectable menu option), so that the user may specify the associated energy consumption directly by selecting the consumption indication 43 at a certain location.

In addition to the above-mentioned possibilities for reducing energy consumption it is recognized that the embodiment herein may reduce the loudness of the entire frequency spectrum $X(f_{SA})$ of the audio signal $S_A$ in order to further reduce power consumption. An upper loudness threshold may be lowered when the charge state C of the rechargeable battery 2 drops. The threshold loudness may be reduced proportionately to the charge state C. If the energy situation is very critical, audio reproduction may also be eliminated entirely, so that only predetermined audio content such as radio traffic reports, news, telephone, and navigational announcements may be output as audio signal $S_A$. The measures for reducing energy consumption may be combined with one another in any desired way. The energy consumption may be calculated as a function of the filter setting and/or the energy value E, and may be fed to a central energy management system or the range information in an electric vehicle.

This application is not restricted to the embodiments shown in the Figures. For example, it is possible to provide for the reduction of energy consumption for a mobile, portable device, such that the user may adjust the consumption through the entry of, for instance, predefined consumption levels. The remaining play time for audio files is then displayed to the user. In especially advantageous manner, the functionality of the device 1 from FIG. 5 can be used for an electric vehicle.

LIST OF REFERENCE CHARACTERS

1 device
101, 102 interface
110, AMP amplifier
120 control unit
121, 122 analysis unit
125 filter
126 selection unit
130, DB database
140, RX receiver
2, Accu energy storage device, rechargeable battery
3 loudspeaker
4, Inp input unit, touch screen
41, 42 input element, widget
43 display element 5, GPS unit for position determination, navigation unit
$A_1$, $A_2$, $A_3$ audio file
B bass frequency component, bass portion
C charge state
E energy value
est calculated curve
f frequency
$f_{G1}$, $f_{G2}$, $f_{G3}$, $f_{G4}$ threshold frequency
$I_{Audio}$ current
$M_N$ normal mode
$M_S$ energy saving mode
P Power
$S_A$ audio signal
$S_{INP}$, $S_{Accu}$, $S_{GPS}$, $S_{RX}$, $S_{SB}$, $C_{fG}$, Signal
Q(E), A(Q)
SubOff control signal
$th_E$ energy threshold
$X(f_{SA})$, $X(f_{A1})$, $X(f_{A2})$, $X(f_{A3})$ frequency response, spectrum

What is claimed is:

1. A device for reproducing an audio signal, the device comprising:
a first interface for connection to an energy storage device;
a second interface for connection to a loud speaker;
an amplifier connectable to the second interface and to the energy storage device for operation, the amplifier being configured to amplify the audio signal;
a control device being connected to the first interface and to the amplifier, the control device being configured to:
operate in a normal mode and in an energy saving mode, wherein in the energy saving mode, power consumption from the energy storage device for reproduction of the audio signal is reduced when compared to the normal mode;
reduce a bass frequency component of a frequency spectrum of the audio signal with the reduced bass frequency component in the energy saving mode;
determine a charge state of the energy storage device;
control a reduction in the bass frequency component based on a decrease in the charge state of the energy storage device; and
control the amplifier to amplify the audio signal and to transmit the amplified audio signal to the loud speaker in the normal mode, and with the reduced bass frequency component, in the energy saving mode,
wherein the control device is further configured to control the reduction in the bass frequency component based on the charge state and a distance to a certain destination, and
wherein the control device is connectable to a database that includes stored audio files
wherein an energy value is stored for each audio file and the energy value is based on the bass frequency component of the frequency spectrum of the audio file, and
wherein the control device is further configured to:
determine an energy threshold based on the charge state of the energy storage device;
determine the audio file to be output based on an associated energy value and based on the energy threshold for purposes of controlling the bass frequency component and
output the audio file as the audio signal.

2. The device of claim 1 wherein the control device is further configured to filter the audio signal to be output through one of a digital filter and a analog filter to reduce the bass frequency component.

3. The device of claim 2 wherein the control device is further configured to determine a threshold frequency of the one of the digital filter and the analog filter based on the charge state of the energy storage device.

4. The device of claim 1 wherein the control device is further configured to activate the energy saving mode based on a signal from an input unit.

5. A method for controlling a reproduction of an audio signal of a device powered by an energy storage device, the method comprising the steps of:
deactivating a normal mode and activating an energy savings mode, wherein power consumption from the energy storage device for reproduction of the audio signal is reduced in the energy savings mode when compared to the normal mode;
reducing, in the energy savings mode, a bass frequency component of a frequency spectrum of the audio signal and outputting the audio signal with a reduced bass frequency component;
ascertaining a charge state of the energy storage device;
controlling a reduction in the bass frequency component based on a decrease in the charge state of the energy storage device;
controlling an amplifier to amplify the audio signal and to transmit the amplified audio signal to a loudspeaker in the normal mode and with the reduced bass frequency component in the energy saving mode;
controlling the reduction in the bass frequency component based on the charge state and on a distance to a certain destination;
storing audio files in a database, each audio filed being provided with an energy value that is based on the bass frequency component of the frequency spectrum;
determining an energy threshold based on the charge state of the energy storage device:
determining the audio file to be output based on the associated energy value and based on an energy threshold for purposes of controlling the bass frequency; and
outputting the audio file as the audio signal.

6. The method of claim 5 further comprising filtering the audio data to be output through one of a digital filter and an analog filter to reduce the bass frequency component.

7. The method of claim 6 further comprising determining a threshold frequency of the one of the digital filter and the analog filter based on the charge state of the energy storage device.

8. The method of claim 5 further comprising activating the energy saving mode based on a signal from an input unit.

9. An apparatus for reproducing an audio signal, the apparatus comprising:
a control device being operably coupled to an energy storage device, the control device being configured to:
transmit the audio signal to an amplifier for amplifying the audio signal for playback via a loudspeaker, the audio signal including a bass frequency component of a frequency spectrum;
receive a charge signal indicative of a charge state of the energy storage device;
enable the loudspeaker to playback the audio signal at the bass frequency component if the charge state is above a predetermined threshold;
reduce the bass frequency component if the charge state is below the predetermined threshold to reduce power consumption; and
control the amplifier to amplify the audio signal and to transmit the amplified audio signal to the loudspeaker in a normal mode, and with the reduced bass frequency component, in an energy saving mode, wherein the control device is capable of being positioned in a vehicle and the control device is further configured to receive a first signal corresponding to a distance between the vehicle and a destination and to reduce the bass frequency component based on the first signal, and wherein the control device is further configured to determine an energy threshold based on a charge state of the energy storage device.

10. The apparatus of claim 9 wherein the control device is further configured to activate one of a digital filter and an analog filter for filtering the audio signal to reduce the bass frequency component thereof.

11. The apparatus of claim 10 wherein the control device is further configured to determine a threshold frequency of the one of the digital filter and the analog filter based on the charge signal.

12. The apparatus of claim 11 wherein the control device is further configured to adjust the threshold frequency of the one of the digital filter and the analog filter in the event the charge state of the energy storage device is decreasing.

13. The apparatus of claim 10 wherein the control device is further configured to associate a plurality of threshold frequencies to a plurality of charge states of the energy storage device, each threshold frequency corresponding to charge state of the energy storage device.

14. The apparatus of claim10 wherein the one of the digital filter and the analog filter is one of a high pass filter and a band pass filter.

15. The apparatus of claim 9 wherein the control device is connectable to a database that includes stored audio files, wherein an energy value is stored for each audio file and the energy value is based on the bass frequency component of the frequency spectrum of the audio file, and wherein the control device is further configured to:

determine the audio file to be output based on an associated energy value and based on the energy threshold for purposes of controlling the bass frequency component; and output the audio file as the audio signal.

* * * * *